United States Patent [19]

Azumai et al.

[11] Patent Number: 4,855,803
[45] Date of Patent: Aug. 8, 1989

[54] SELECTIVELY DEFINABLE SEMICONDUCTOR DEVICE

[75] Inventors: Hideo Azumai, Takarazuka; Koichi Fujii, Toyonaka; Takashi Seigenji, Minoo; Keiichi Yoshioka, Nishinomiya, all of Japan

[73] Assignee: Ricoh Company, Ltd., Tokyo, Japan

[21] Appl. No.: 224,268

[22] Filed: Jul. 26, 1988

Related U.S. Application Data

[63] Continuation of Ser. No. 884,391, Jul. 11, 1986, abandoned.

[30] Foreign Application Priority Data

Sep. 2, 1985 [JP] Japan .................... 60-194563
Sep. 6, 1985 [JP] Japan .................... 60-198103

[51] Int. Cl.⁴ .................... H01L 27/10; H01L 27/15; H01L 27/02
[52] U.S. Cl. ........................ 357/45; 357/40; 357/41; 365/63; 365/95; 365/96; 365/103; 365/104; 365/154; 365/156
[58] Field of Search ............... 357/45, 45 M, 40, 41; 365/95, 96, 63, 154, 156, 103, 104

[56] References Cited

U.S. PATENT DOCUMENTS

| T101,804 | 5/1982 | Balyoz et al. | 357/45 |
|---|---|---|---|
| 3,798,621 | 3/1974 | Baitinger et al. | 365/95 |
| 3,969,706 | 7/1976 | Proebsting et al. | 365/207 |
| 4,005,393 | 1/1977 | Schnerba | 365/230 |
| 4,072,932 | 2/1978 | Kitagawa et al. | 365/207 |
| 4,103,185 | 7/1978 | Denes | 365/156 |
| 4,161,662 | 7/1979 | Malcolm et al. | 357/45 |
| 4,553,053 | 11/1985 | Ong et al. | 365/208 |
| 4,584,669 | 4/1986 | Moynihan et al. | 355/95 |
| 4,623,911 | 11/1986 | Pryor | 357/45 |

FOREIGN PATENT DOCUMENTS

| 57-27109 | 8/1983 | Japan | 357/45 |
|---|---|---|---|
| 59-11670 | 1/1984 | Japan | 357/40 |
| 60-50695 | 3/1985 | Japan | 365/95 |
| 60-64447 | 4/1985 | Japan | 357/23.5 |
| 60-105251 | 6/1985 | Japan | 357/40 |

Primary Examiner—Andrew J. James
Assistant Examiner—Ngan Van Ngo
Attorney, Agent, or Firm—Cooper & Dunham

[57] ABSTRACT

A selectively definable semiconductor device is provided. In one form, a composite gate array includes a plurality of logic dedicated general purpose cell regions and a plurality of function dedicated cell regions each of which is disposed between the two corresponding ones of the plurality of logic dedicated general purpose cell regions, whereby each of the cell regions may be used as an interconnection region selectively. In another form, a semiconductor memory device which may be selectively defined as a ROM or a RAM by a metalization process is provided.

7 Claims, 4 Drawing Sheets

SELECTIVELY DEFINABLE SEMICONDUCTOR DEVICE

This is a continuation of application Ser. No. 884,391, filed July 11, 1986 now abandoned.

BACKGROUND OF THE INVENTION

1. Field of the Invention

This invention relates to a semiconductor device, and, in particular, to a selectively definable semiconductor device whose function and/or structure may be selectively defined, as desired. More specifically, the present invention relates to a composite gate-array semiconductor device including both a general purpose cell region only for a logic function and a dedicated cell regions for a particular function, each region being capable of serving as an interconnection region.

2. Description of the Prior Art

A gate-array semiconductor device is an integrated logic circuit, wherein a masterslice chip having a predetermined array of cells is fabricated in advance and then a desired interconnection is formed on the masterslice chip to define a desired functional circuit. Such a gate-array semiconductor device is particulary suited for manufacturing semiconductor integrated circuit devices small in number but large in variety in a short period of time and low at cost.

In order to increase the level of integration, there is proposed a gate array semiconductor device having an exclusive region for a read only memory (ROM) or random access memory (RAM). Such a gate array device including an exclusive memory region has advantages of excellent memory characteristic, such as short access time, and of increased density; however, the effective integration level becomes rather lowered if the memory capacity required by the user is smaller than the memory capacity of the exclusive memory region provided in the masterslice.

As disclosed in Japanese Patent Laid-open Pub. No. 59-11670, there is also proposed a semiconductor integrated circuit device provided with two kinds of first general purpose cells exclusive use for logic functions and second general purpose cells exclusive use for memory, wherein the first general purpose cells are used for interconnections where a large memory capacity is required and the second general purpose cells are used for interconnections where a large capacity for logic functions is required so as to optimize the rate of cell use irrespective of the required ratio between memory elements and logic elements. However, with such an approach, although there is a flexibility for the memory capacity and for placement in the gate-array chip, the level of integration is not so high and the memory characteristic is not so good.

SUMMARY OF THE INVENTION

It is therefore a primary object of the present invention to obviate the disadvantages of the prior art as described above and to provide an improved semiconductor device.

It is another object of the present invention to provide a selectively definable semiconductor device whose structure and/or function can be defined selectively.

A further object of the present invention is to provide a composite gate-array semiconductor device excellent in flexibility and operating characteristic and high in level of integration.

A still further object of the present invention is to provide a semiconductor device including a memory cell which can be defined to function as a read only memory (ROM) cell or a random access memory (RAM) cell.

Other objects, advantages and novel features of the present invention will become apparent from the following detailed description of the invention when considered in conjunction with the accompanying drawings.

DESCRIPTION OF THE PREFERRED EMBODIMENTS

Figure 1:
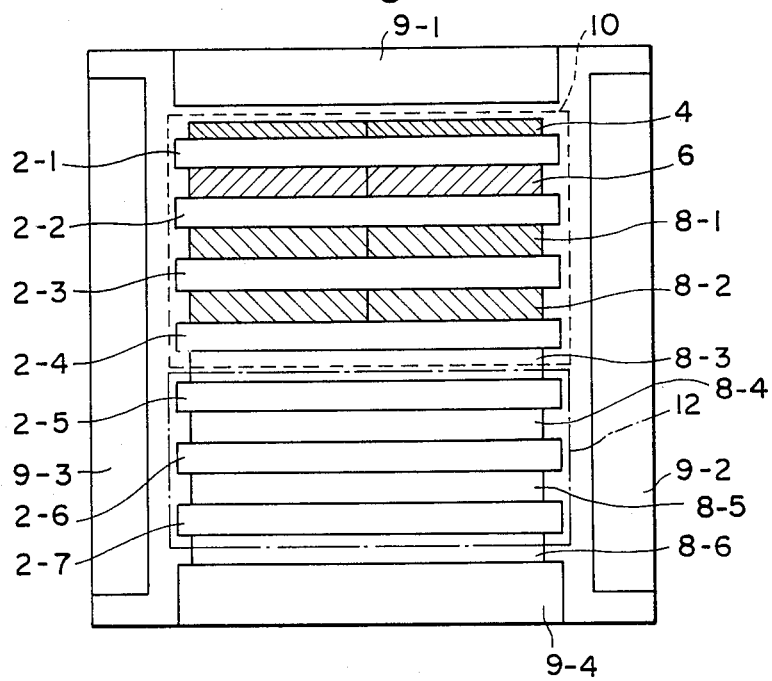
FIG. 1 is a schematic illustration showing the layout of a composite gate-array semiconductor device constructed in accordance with one embodiment of the present invention.

Referring now to FIG. 1, there is schematically shown a composite gate-array semiconductor chip constructed in accordance with one embodiment of the present invention. The illustrated composite gate-array semiconductor chip includes a plurality of general purpose cell regions 2-1 through 2-7 exclusive use for logic functions. Although these cell regions 2-1 through 2-7 are indicated by elongated blocks, there are, in fact, a number of cells arranged in the form of an array in each of these regions. Also provided on the chip includes dedicated regions 4, 6 and 8-1 through 8-3 for particular functions. For example, the dedicated regions 4, 6 and 8-1 through 8-3 are dedicated for different functions C, B and A, respectively. It is to be noted that these function dedicated regions 4, 6 and 8-1 through 8-3 are each arranged between the two adjacent logic dedicated general purpose cell regions 2. Each of the function dedicated regions 4, 6 and 8-1 through 8-3 is structured to have a desired function, such as any of the functions implemented by a memory, A/D converter, operational amplifier and arithmetic logic unit (ALU). The function dedicated cell regions 4, 6 and 8-1 through 8-3 are previously so arranged that they can define a circuit capable of carrying out a desired function with ease. Also provided in the illustrated chip include general purpose chip regions 9-1 through 9-4 for exclusive use of transmitting and receiving input/output signals to and from the exterior.

In the embodiment shown in FIG. 1, a memory region 10 is formed as indicated by the dotted line and a random logic region 12 is defined by the one-dotted line. Thus, in the memory region 10, the function dedicated cell regions 4, 6, 8-1 and 8-2 are defined as memory cell regions and the logic dedicated general purpose cell regions 2-1 through 2-4 are used as interconnection regions so that interconnection patterns are formed on these regions 2-1 through 2-4, thereby interconnecting the function dedicated cell regions 4, 6, 8-1 and 8-2. On the other hand, in the random logic region 12, the function dedicated memory cell regions 8-4 through 8-6 are used as interconnection regions so that desired interconnection patterns are formed on these regions 8-4 through 8-6 thereby interconnecting the logic dedicated general purpose cell regions 2-5 through 2-7, which defines a desired logic circuit.

Figure 2:
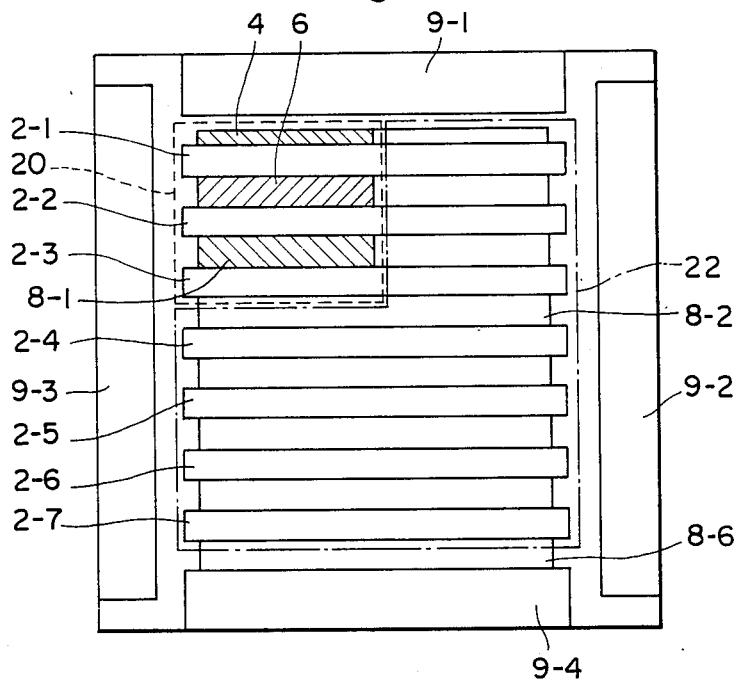
FIG. 2 is a schematic illustration showing the layout of a composite gate-array semiconductor device constructed in accordance with another embodiment of the present invention.

FIG. 2 shows another composite gate-array device which is constructed from the same kind of masterslice as used for the embodiment of FIG. 1 and which includes a memory region 20 and a random logic region 22. Thus, the ratio between memory region and random logic region differs between the embodiment shown in FIG. 1 and the embodiment shown in FIG. 2. Similarly as in the case of FIG. 1, in the memory region 20 of the gate-array device shown in FIG. 2, the left-half of each of the logic dedicated general purpose cell regions 2-1 through 2-3 is used as an interconnection region; on the other hand, in the random logic region 22, the function dedicated cell region are used exclusively as interconnection regions.

Figure 3:
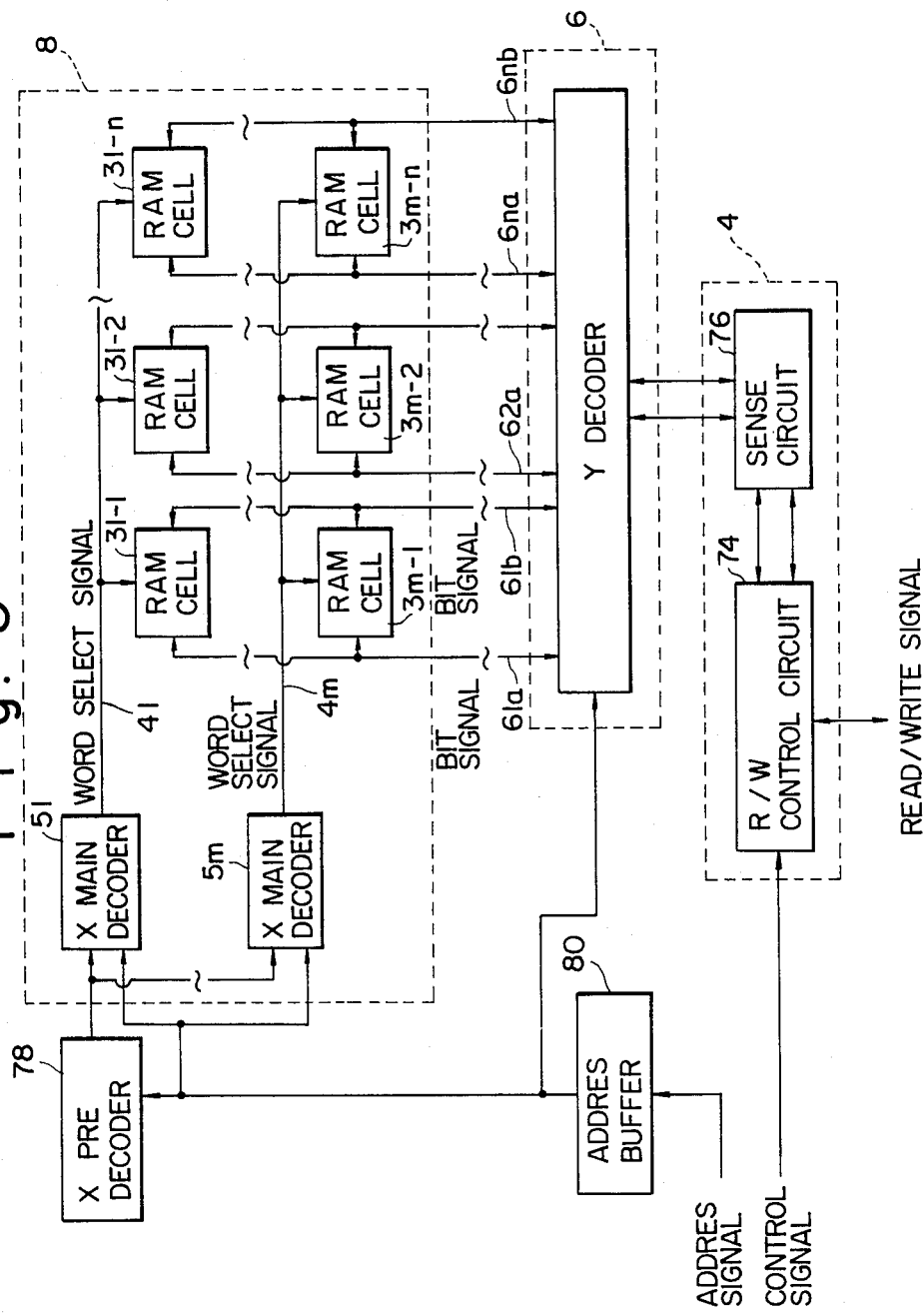
FIG. 3 is a block diagram showing an example of defining a RAM in a composite gate-array device by providing interconnections in accordance with a further embodiment of the present invention.

FIG. 3 shows the case where a RAM is defined by providing interconnections to a masterslice chip including both logic dedicated general purpose cell regions including elements 78 and 80 and function dedicated cell regions 4, 6 and 8 in accordance with one embodiment of the present invention. The structure illustrated in FIG. 3 includes a function dedicated cell region 8 dedicated for a particular function A, which region includes m×n RAM cells 31-1 through 3m-n, X-main decoders 51 through 5m, word lines 41-4m and bit lines 61a through 6nb. A set of RAM cells 31-1 through 31-n are commonly connected to the word line 41 which is under control of the X-main decoder 51, and, similarly, other sets of RAM cells are commonly connected to the corresponding word lines which are under control of the corresponding particular X-main decoders. Also provided in the structure of FIG. 3 is a function dedicated cell region 6 dedicated for a particular function B, which region includes a Y-decoder 72 and a pull-up transistor function for each of the bit lines 61a through 6nb. The structure of FIG. 3 further includes a function dedicated cell region 4 dedicated for a particular function C, which region includes a read/write control circuit 74 and a sense circuit 76.

The interconnection between the function dedicated cell region 8 for function A and the function dedicated cell region 6 for function B is provided by an interconnection defined in the logic dedicated general purpose cell region present between the function dedicated regions 8 and 6. Similarly, the logic dedicated general purpose cell region present between the function dedicated cell regions 6 and 4 is used as an interconnection region for establishing a required interconnection between the two regions 6 and 4. Also provided in the structure of FIG. 3 are a X-predecoder 78 and an address buffer 80, which are not provided in any of the function dedicated cell regions 4, 6 and 8 so as to provide flexibility for an increase or decrease of the capacity of RAM. Either of the X-predecoder 78 and address buffer 80 is formed using the cells in the logic dedicated general purpose cell region.

It is to be noted that a function to be provided to the function dedicated cell region should not be limited to any particular one of those illustrated in FIG. 3, and any desired functional circuit may be defined in any of the function dedicated cell region. Besides, three or more different kinds of functional circuits can be provided on the same semiconductor chip.

Accordingly, in accordance with this aspect of the present invention, there is provided a masterslice semiconductor chip provided with function dedicated cell regions and logic dedicated general purpose cell regions, each capable of serving as an interconnection region. Thus, those portions of the function dedicated cell regions and logic dedicated general purpose regions which are not used for defining particular functional circuits can be used as interconnection regions, and, thus, a ratio between function (such as memory) dedicated regions and random logic regions may be set arbitrarily. In addition, since the function dedicated cell region is constructed in advance to have a particular structure for implementing a particular function, it can provide an excellent circuit characteristic, stable operating characteristic and high integration.

Figure 4:
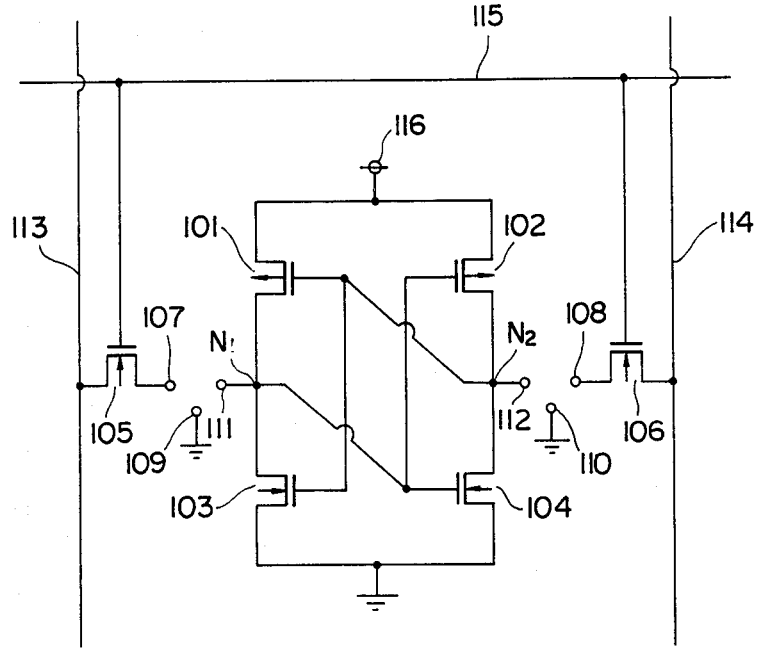
FIG. 4 is a circuit diagram showing a memory cell selectively definable either a ROM or RAM cell by wiring constructed in accordance with a still further embodiment of the present invention.

FIG. 4 shows a memory cell which can be defined either as a ROM cell or a RAM cell by selective wiring and which doubles the memory capacity when defined as a ROM cell. As shown in FIG. 4, the illustrated memory cell includes a pair of PMOS transistors 101 and 102 serving as load resistors and a pair of NMOS transistors 103 and 104 serving as driver transistors. Each of the NMOS transistors 103 and 104 has its source connected to ground and each of the PMOS transistors 101 and 102 has its source connected to supply voltage 116. The drains of the transistors 101 and 103 are commonly connected to define a node N1 which is connected to the gate of each of transistors 102 and 104. Similarly, the drains of the transistors 102 and 104 are commonly connected to define a node N2 which is connected to the gate of each of transistors 101 and 103. A flip-flop is defined by these transistors 101 through 104 connected as described above.

Bit lines 113 and 114 run vertically in FIG. 4 on both sides of the flipflop, wherein the bit line 113 is connected to the drain of an NMOS transistor 105 and the bit line 114 is connected to the drain of another NMOS transistor 106. These transistors 105 and 106 serve as gates when a read/write operation is carried out. A word line 115 runs horizontally in FIG. 4 and it is connected to the gate of each of transistors 105 and 106.

The transistor 105 has its source connected to a contact 107, and a contact 111 is provided as connected to the node N1 of the flipflop. Also provided in the vicinity of these contacts 107 and 111 is a further contact 109 which is connected to ground. It is to be noted that these three contacts 107, 109 and 111 are so arranged that either contacts 107 and 109 or contacts 107 and 111 can be electrically connected by metalization or when an interconnection layer is provided on the semiconductor structure shown in FIG. 4. Similarly, the transistor 106 has its source connected to a contact 108, and a contact 112 is provided as connected to the node N2 of the flipflop. Another contact 110 is provided as connected to ground and in the vicinity of the contacts 108 and 112. These contacts 108, 110 and 112 must also be so arranged that either contacts 108 and 110 or contacts 108 and 112 can be electrically connected by wiring or metalization.

Figure 5:
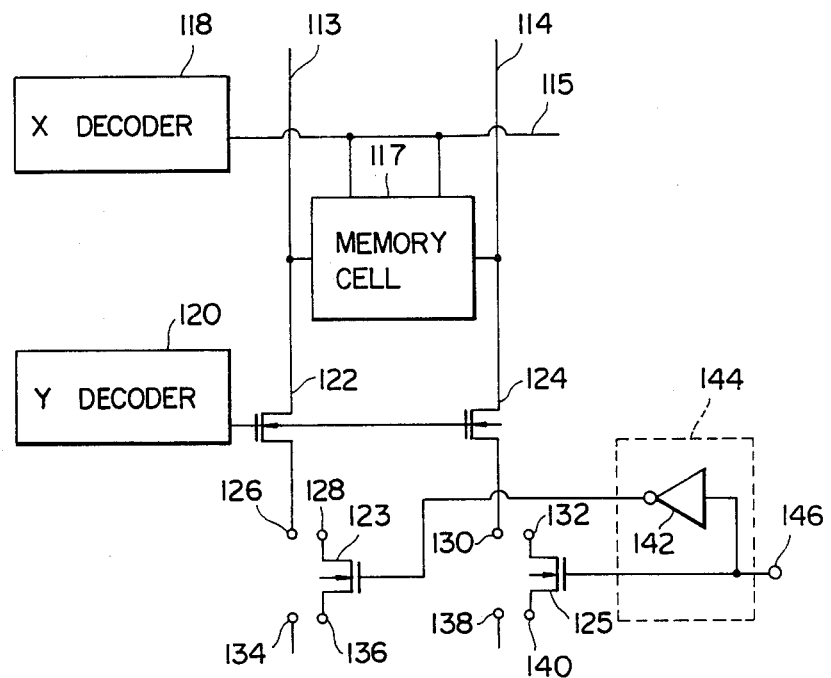
FIG. 5 is a semiconductor memory device containing the memory cell shown in FIG. 4.

FIG. 5 shows a memory circuit constructed in accordance with one embodiment of the present invention and including a memory cell 117 having the structure shown in FIG. 4. The word line 115 is connected to a X-decoder 118 and the pair of bit lines 113 and 114 is connected to MOS transistors 122 and 124, respectively, whose gates are connected to a Y-decoder 120. The pair of bit lines 113 and 114 are disconnected at an appropriate location which may be determined arbitrary. A pair of contacts 126 and 134 is provided at both ends of the bit line 113 where disconnected. And, a MOS transistor 123 is disposed in the vicinity of this pair of contacts 126 and 134, and the MOS transistor 123 has its source and drain connected to contacts 128 and 136, respectively. These four contacts 126, 128, 134 and 136 are so arranged that either contacts 126 and 134 or contacts 126 and 128 as well as contacts 134 and 136 are electrically connected by metal interconnection. Similarly, the bit line 114 is also provided with a pair of contacts 130 and 138 at the location where disconnected, and a MOS transistor 125 is disposed in the vicinity of this pair of contacts 130 and 138. The MOS transistor 125 has its source and drain connected to a pair of contacts 132 and 140. And, these four contacts 130, 132, 138 and 140 are also so arranged that either contacts 130 and 138 or contacts 130 and 132 as well as contacts 138 and 140 may be connected by providing a metal interconnection.

Also provided in the structure shown in FIG. 5 is a decoder 144 provided with an inverter 142 and equivalent to one bit. The output of the decoder 144 is connected to the gate of the MOS transistor 123, and the input of the decoder 144 is connected to the gate of the MOS transistor 125 and also to an input terminal 146.

In the case where the illustrated cell is to be used as a RAM cell, an electrical connection is provided between the contacts 107 and 111 as well as 108 and 112 in the structure shown in FIG. 4, and an electrical connection is provided between the contacts 126 and 134 and also between the contacts 130 and 138 in the structure shown in FIG. 5. The provision of such electrical connections is preferably carried out by metalization using an interconnection mask. In this case, a metal interconnection pattern is formed on top of the semiconductor device, thereby providing electrical connections between points, as desired. With the provision of such electrical connections, a group of RAM cells in the row direction can be designated by the X-decoder 118 and a group of RAM cells in the column direction can be designated by the Y-decoder 120, so that an any desired address may be designated by a combination of X and Y decoders 118 and 120.

On the other hand, in the case where this memory cell is to be used as a ROM cell, the contact 107 of transistor 105 is electrically connected to the ground contact 109 by a metal line or left unconnected, thereby defining a ROM cell having a fixed state of either "0" or "1" depending on presence or absence of an electrical connection between the contacts 107 and 109, and, furthermore, the contact 108 of transistor 106 is electrically connected to the ground contact 110 by a metal line or left unconnected, thereby defining another ROM cell having a fixed state of either "0" or "1" depending on presence or absence of an electrical connection between the contacts 108 and 110. In this manner, in accordance with the present invention, there are produced two ROM cells from a single memory cell when it is defined in a ROM format. In addition, for the bit line 113, an electrical connection is provided not only between the contacts 126 and 128, but also between the contacts 134 and 136, and for the bit line 114, the contacts 130 and 132 and the contacts 138 and 140 are electrically connected, respectively. As a result, two ROM cells in the memory device can be selected by the X and Y decoders 118 and 120, and either one of these two ROM cells is selected by the decoder 144. Accordingly, the decoder 144 effectively increases the ability of the Y-decoder 120 by one bit.

It should be noted that the memory cell may be constructed by using an NMOS element instead of a CMOS element as described above. In the embodiment described above, a plurality of contacts are provided and these contacts are selectively connected by metal interconnections to define either a RAM cell or ROM cell. However, the memory cell of the present invention may also be constructed using a gate array. In this case, using a mask, contact holes are first formed at the locations of the contacts to be connected, and, then, a metal interconnection pattern is formed to establish necessary electrical connections. In gate array, the structure of Y-decoder may be easily altered. Thus, the present memory device, whose number of bits changes depending on whether it is formed to be a RAM cell or ROM cell, may be advantageously formed using a gate array.

A further aspect of the present invention will now be described with reference to FIGS. 6 and 7. In accordance with this aspect of the present invention, there is provided a single chip semiconductor device including a plurality of cells whose interconnection can be established after completion of wafer process. That is, an interconnection region is provided between two cell regions and the interconnection region includes a plurality of interconnection lines and a programmable element between the two interconnection lines, whereby an electrical connection between two interconnection lines may be established arbitrarily after wafer process. The programmable element for use in the present invention may be any element which can establish either a conductive state or a non-conductive state, and, such an element includes an electrically programmable element, fusable element, and a programmable element by junction breakdown, e.g., PROM, EPROM, EEPROM and EAROM.

Figure 6:
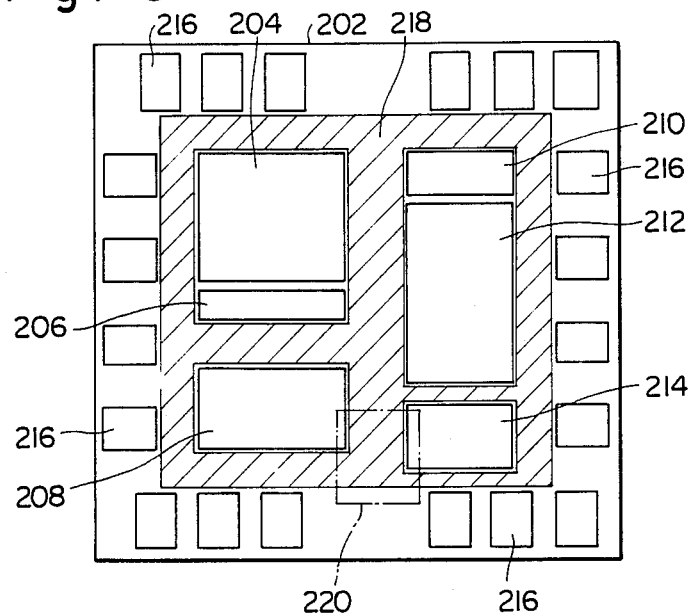
FIG. 6 is a schematic illustration showing a one-chip microcomputer constructed in accordance with a still further embodiment of the present invention.

Referring now to FIG. 6, there is schematically shown a one-chip microcomputer constructed in accordance with one embodiment of this aspect of the present invention. The illustrated structure includes a silicon substrate 202 on which is arranged as cells a micro-CPU 204, an address decoder 206, a memory 208, an interrupt controller 210, a peripheral controller 212 and a timer 214. And around the peripheral portion of the substrate 202 is provided a plurality of I/O cells 216 as input/output buffer circuits. A shaded region 218 indicates an interconnection region including interconnection lines and programmable elements for selectively connecting two or more of the interconnection lines.

Figure 7:
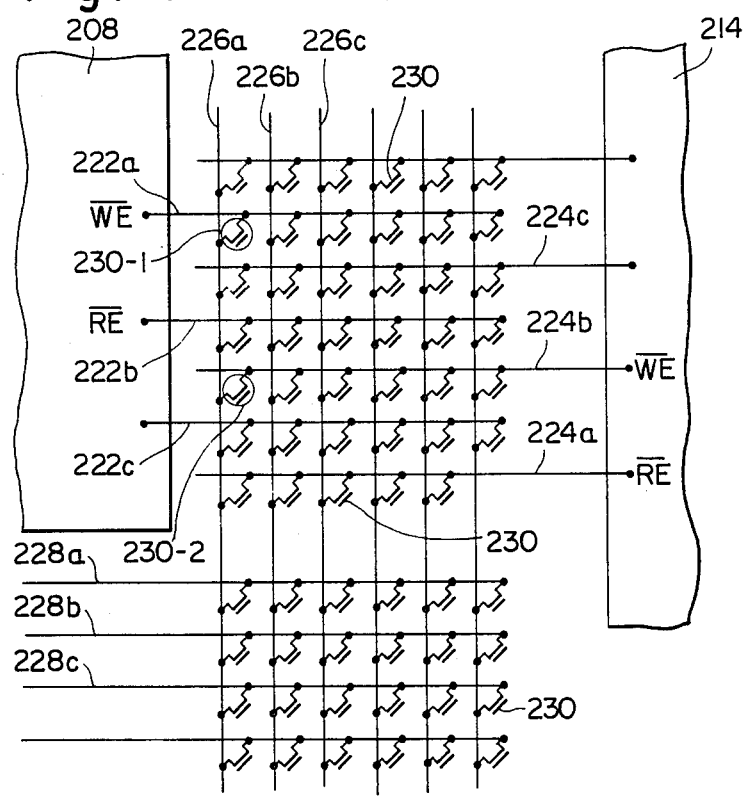
FIG. 7 is a fragmentary view showing in detail an interconnection portion of the structure shown in FIG. 6.

FIG. 7 is a schematic illustration showing the detailed structure of that portion of the interconnection region 218 which is enclosed by a square 220 indicated by the one-dotted line. As shown in FIG. 7, the interconnection region includes a first set of interconnection lines 222a, 222b and 222c extending from the cell 208, a second set of interconnection lines 224a, 224b, 224c, etc. extending from the cell 214, a third set of interconnection lines 226a, 226b, 226c, etc. running vertically and crossing the first and second set of interconnection lines, and a fourth set of interconnection lines 228a, 228b, 228c, etc. running horizontally and crossing the third set of interconnection lines. And, at each crossover point between the two crossing interconnection lines, there is provided a FAMOS 230 as a programmable element.

With the structure shown in FIG. 7, if it is desired to establish an electrical connection between a $\overline{WE}$ terminal of the cell 208 and a $\overline{WE}$ terminal of the cell 214, it is only necessary to have FAMOS elements 230-1 and 230-2 programmed to be in conductive state. When these elements are so programmed, the $\overline{WE}$ terminals of the cells 208 and 214 are electrically connected through the interconnection lines 222a, 226a and 224b. An electrical connection may be established between other terminals in the same manner. The mechanism of programming a FAMOS device is well known and when a high voltage is applied to its drain, hot electrons are introduced into its floating gate, thereby increasing the threshold voltage to set the device in a non-conductive state. On the other hand, if no such high voltage is applied to the drain, the FAMOS device remains in a conductive state.

FIG. 6 shows the case when the present invention is applied to one-chip microcomputer; however, the present invention may also be applied to any other type of one-chip integrated circuit device. In addition, in the structure of FIG. 6, the I/O cells 216 are provided around the peripheral portion of the substrate 202, but these I/O cells 216 may also be provided in an inside region of the substrate 202. It should also be noted that although all of the interconnection lines provided in the interconnection region 218 of the illustrated embodiment are connected to each other through programmable elements; however, some of the interconnection lines may be directly connected, if desired. In the embodiment shown in FIG. 6, an address of the memory 208 and the peripheral controller 212 may be set arbitrarily by appropriately programming the interconnection region 218. And, to set each cell whether it uses an interrupt or not can be set arbitrarily when programming the interconnection region 218. Moreover, the interconnection region 218 may be suitably programmed to set designation of a particular pin of the I/O cells 216 and to select whether a particular cell is to be used or not. Instead of EPROM used in the illustrated embodiment as a programmable element, if use is made of an reprogrammable element, such as EEPROM or EAROM, the program once set in the interconnection region 218 may be altered later.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A composite gate-array semiconductor device, comprising:
    a plurality of logic dedicated general purpose cell regions, each capable of providing a desired logic function and also capable of providing an interconnection function selectively;
    a plurality of function dedicated cell regions, each capable of providing a desired function and also capable of providing an interconnection function selectively, each of said plurality of function dedicated cell regions being disposed between two corresponding ones of said plurality of logic dedicated general purpose cell regions;
    a pair of adjacent bit lines;
    wherein said plurality of function dedicated cell regions include a plurality of RAM/ROM cells which can be selectively defined either as RAM cells or as ROM cells by metallization and which are connected to said adjacent bit lines; and
    a one-bit decoder which is connected between said pair of adjacent bit lines when said plurality of RAM/ROM cells are defined as ROM cells.

2. The device of claim 1 wherein said regions, each elongated in shape, are arranged in a row spaced apart from each other.

3. The device of claim 1 wherein at least some of said plurality of logic dedicated general purpose cell regions are interconnected by some of said plurality of function dedicated cell regions to define a desired random logic function, whereby said some of said plurality of function dedicated cell regions serve as interconnection regions.

4. The device of claim 1 wherein at least one of said plurality of function dedicated cell regions has a function as a memory, D/A converter, operational amplifier or arithmetic logic unit.

5. The device of claim 1 wherein said plurality of function dedicated cell regions include a plurality of RAM cells arranged in a plurality of rows; a plurality of first X decoders each provided for each row of said plurality of RAM cells; a Y decoder operatively associated with each of said plurality of RAM cells; a sense circuit operatively associated with said Y decoder; and a R/W control circuit operatively associated with said sense circuit.

6. The device of claim 5 wherein said plurality of logic dedicated general purpose cell regions include a second X decoder operatively associated with each of said plurality of first X decoders.

7. The device of claim 6 wherein said plurality of logic dedicated general purpose cell regions further include an address buffer which is operatively associated with said second X decoder and said Y decoder.

* * * * *